US006771499B2

(12) United States Patent
Crippen et al.

(10) Patent No.: US 6,771,499 B2
(45) Date of Patent: Aug. 3, 2004

(54) SERVER BLADE CHASSIS WITH AIRFLOW BYPASS DAMPER ENGAGING UPON BLADE REMOVAL

(75) Inventors: Martin Joseph Crippen, Apex, NC (US); Jason Aaron Matteson, Raleigh, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 10/306,302

(22) Filed: Nov. 27, 2002

(65) Prior Publication Data

US 2004/0100765 A1 May 27, 2004

(51) Int. Cl.⁷ .............................. G06F 1/20; H05K 7/20
(52) U.S. Cl. .................. 361/687; 361/683; 361/695; 16/277
(58) Field of Search ..................... 361/683, 687–695, 361/610, 616; 16/229–392; 415/213.1; 165/80.3; 312/223.1–223.2

(56) References Cited

U.S. PATENT DOCUMENTS

| 5,773,755 | A | * | 6/1998 | Iwatare | 174/17 VA |
|---|---|---|---|---|---|
| 6,181,557 | B1 | * | 1/2001 | Gatti | 361/695 |
| 6,345,415 | B1 | * | 2/2002 | Laning | 16/268 |
| 2002/0191376 | A1 | * | 12/2002 | Ota et al. | 361/695 |
| 2003/0091433 | A1 | * | 5/2003 | Tam et al. | 415/146 |

* cited by examiner

*Primary Examiner*—Darren Schuberg
*Assistant Examiner*—Anthony Q. Edwards
(74) *Attorney, Agent, or Firm*—Martin J. McKinley

(57) ABSTRACT

A server blade system includes a plurality of slots for receiving server blades. The system includes an air moving device to move air through each of the server blades installed in the system. When one of the server blades is removed, a bypass damper rotates into the empty slot to obstruct the flow of air through the slot. The bypass damper is pivotally mounted within each slot and includes a torsion spring to move the damper into the obstruction position. Two hinge pin mounts, which are "U" shaped in cross section, provide a snap fit for two hinge pins positioned at one end of the bypass damper. A spring mounting pin is positioned between the two hinge pins and a torsion spring is mounted over the spring mounting pin.

7 Claims, 10 Drawing Sheets

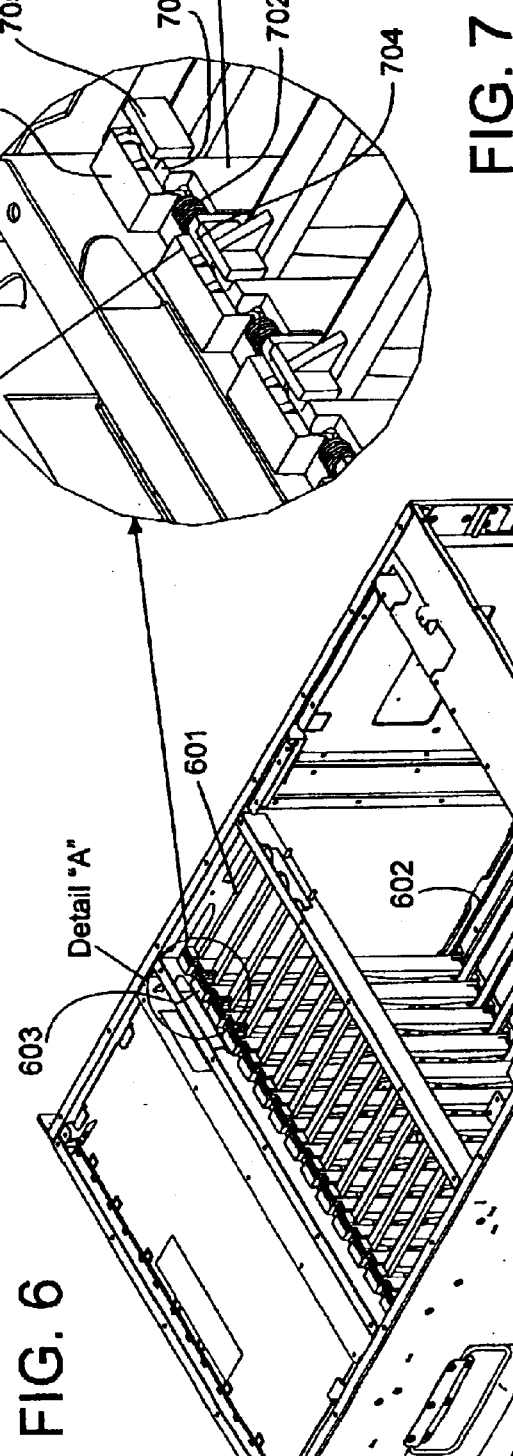

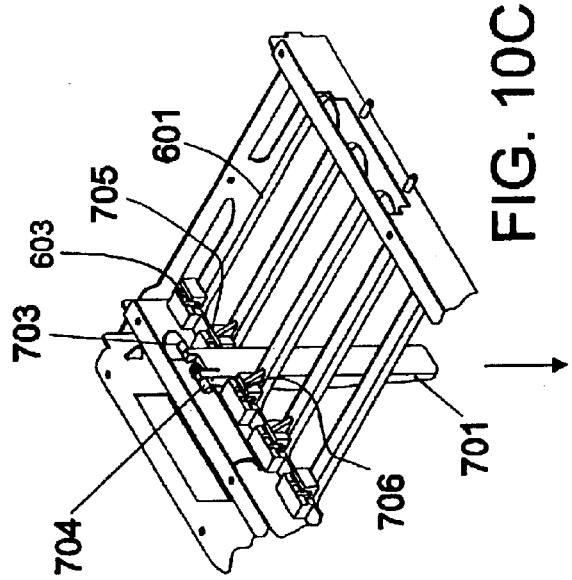
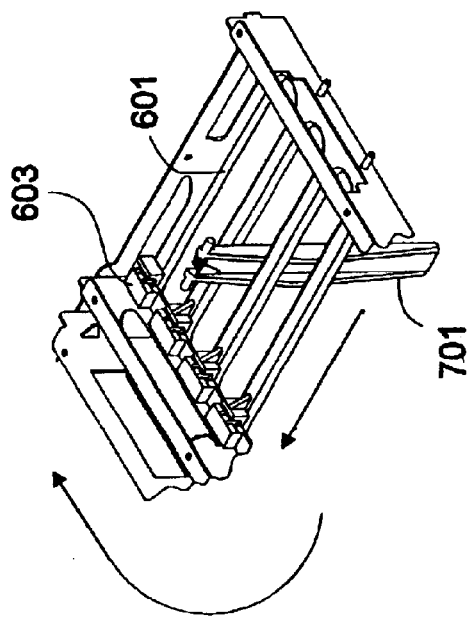
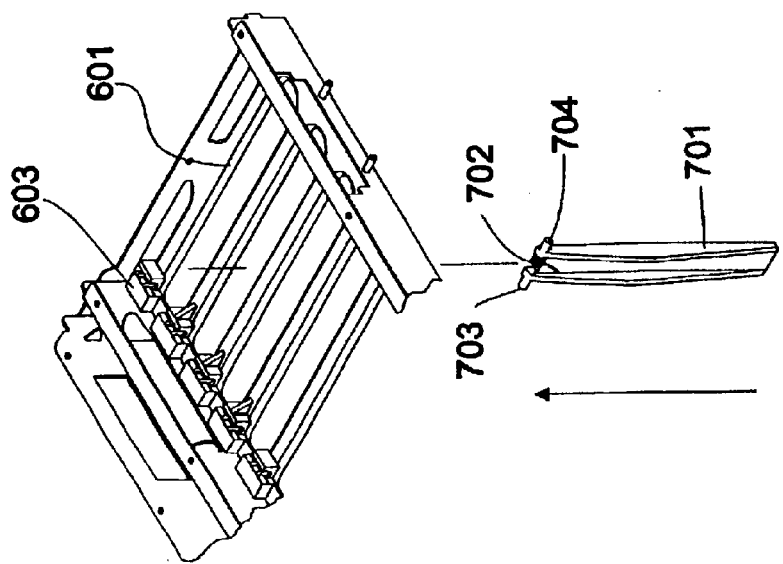

SERVER BLADE CHASSIS WITH AIRFLOW BYPASS DAMPER ENGAGING UPON BLADE REMOVAL

BACKGROUND OF THE INVENTION

This invention pertains to computers and other information processing systems and, more particularly, to an airflow damper for a server blade system.

Server blade systems include a main chassis into which a plurality of "sever blades" are slidable inserted into slots in the front of the main chassis. Each server blade includes the majority of the components of a conventional server, minus certain components that are included in the main chassis and are shared among all the server blades in the chassis. These shared components include power supplies, network switches and air moving devices such as fans and blowers.

The air moving devices move air from the front of the main chassis, through the server blades and other components, and exhaust the air out the back of the chassis. Because of the density of the server blades in the chassis, a significant amount of heat is generated by the blades, and the flow of air through each of the server blades is essential. In a densely packed server blade chassis, the interruption of air flow through any one or more of the server blades can result in thermal overload problems in a matter of minutes or even less.

Since the server blades are usually hot plugable, they can be removed from the main chassis without the need to shut down the chassis and all its components. However, removing a blade from the chassis leaves a slot open, thereby changing the flow of air through the system. More particularly, the flow of air through all the server blades in the system is roughly equal, but when one of the blades is removed and its slot is left opened, a disproportionate volume of air flows through the open slot and the air flow through the remaining blades is reduced. Thus, the removal of a blade from its slot creates a "fluid short circuit" that results in a reduction of air flow through the server blades, and an increase in air flow through the open slot. To overcome this problem, the invention described below provides an air flow damper in each of the slots that swings into place upon removal of a blade and partially blocks the flow of air through the open slot.

SUMMARY OF THE INVENTION

Briefly, the invention is a server blade system for use with first and second server blades, wherein each server blade has at least one air flow opening. The server blade system includes a chassis having first and second slots, wherein a server blade can be inserted into each of said slots. An air moving device is included for moving air through a first server blade installed in the first slot. A bypass damper having first and second positions is positioned in the second slot. The bypass damper obstructs the flow of air through the second slot when the bypass damper is in the second position. The bypass damper moves into the first position when a second server blade is inserted into the second slot, and the bypass damper moves to the second position when the second server blade is removed from the second slot.

BRIEF DESCRIPTION OF THE DRAWINGS

FIG. 6 is perspective view of the back of the server blade chassis with the cover removed exposing the blade slot guide and bypass dampers.

FIG. 7 is a perspective view of Detail "A" of FIG. 6.

FIGS. 10A through 10C are perspective views that illustrate the steps necessary to install the bypass damper in the hinge pin mounting strip.

DESCRIPTION OF THE PREFERRED EMBODIMENTS

Server Blade System Overview

Figure 1:
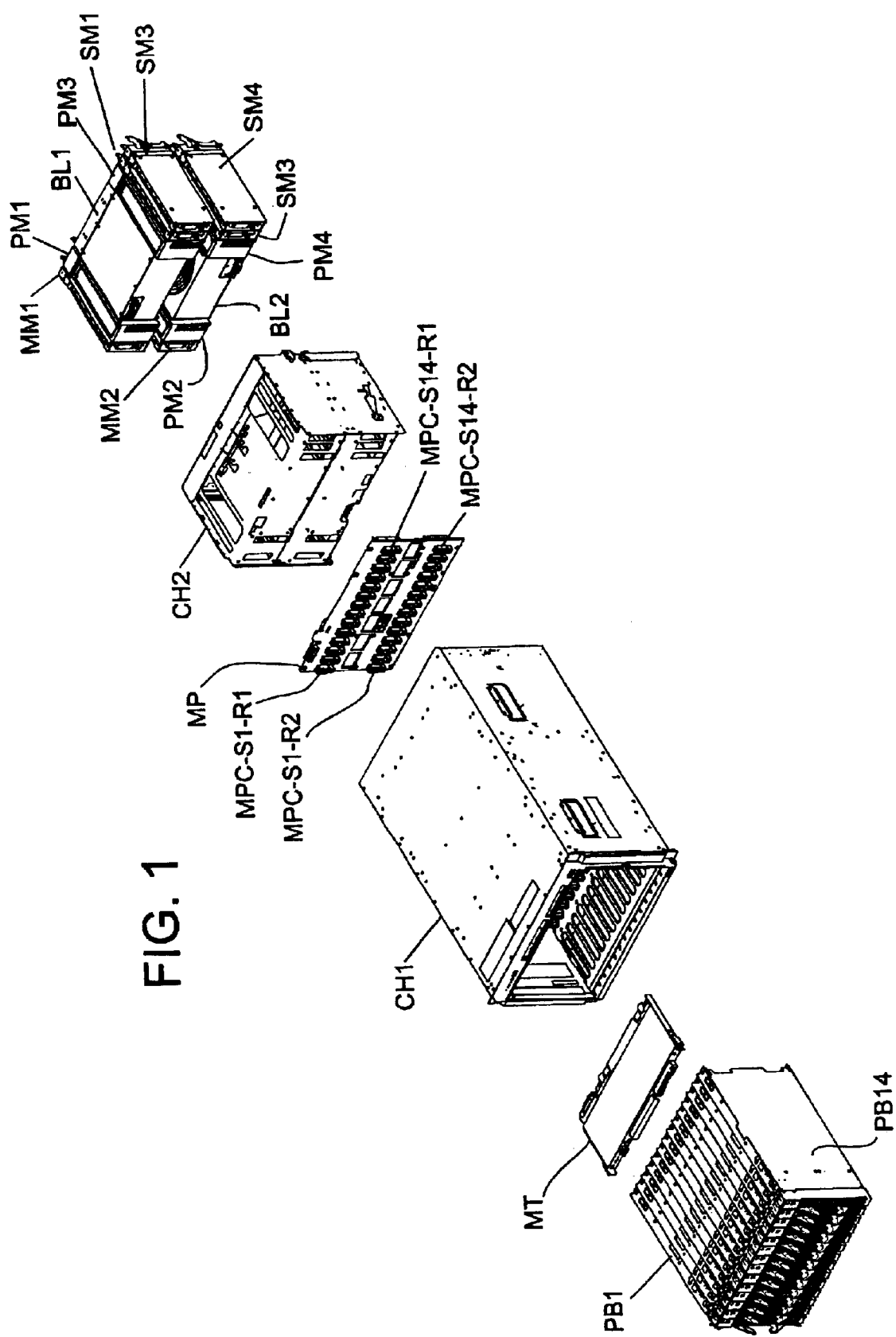
FIG. 1 is a front, top and right side exploded perspective view of a server blade system of the present invention.

FIG. 1 is a front, top and right side exploded perspective view of a server blade system. Referring to this figure, main chassis CH1 houses all the components of the server blade system. Up to 14 processor blades PB1 through PB14 (or other blades, such as storage blades) are hot plugable into the 14 slots in the front of chassis CH1. The term "server blade", "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Processor blades provide the processor, memory, hard disk storage and firmware of an industry standard server. In addition, they include keyboard, video and mouse ("KVM") selection via a control panel, an onboard service processor, and access to the floppy and CD-ROM drives in the media tray. A daughter card is connected via an onboard PCI-X interface and is used to provide additional high-speed links to switch modules SM3 and SM4 (described below). Each processor blade also has a front panel with 5 LED's to indicate current status, plus four push-button switches for power on/off, selection of processor blade, reset, and NMI for core dumps for local control.

Blades may be 'hot swapped' without affecting the operation of other blades in the system. A server blade is typically implemented as a single slot card (394.2 mm×226.99 mm); however, in some cases a single processor blade may require two slots. A processor blade can use any microprocessor technology as long as it compliant with the mechanical and electrical interfaces, and the power and cooling requirements of the server blade system.

For redundancy, processor blades have two signal and power connectors; one connected to the upper connector of the corresponding slot of midplane MP (described below), and the other connected to the corresponding lower connector of the midplane. Processor Blades interface with other components in the server blade system via the following midplane interfaces: 1) Gigabit Ethernet (2 per blade; required); 2) Fibre Channel (2 per blade; optional); 3)

management module serial link; 4) VGA analog video link; 4) keyboard/mouse USB link; 5) CD-ROM and floppy disk drive ("FDD") USB link; 6) 12 VDC power; and 7) miscellaneous control signals. These interfaces provide the ability to communicate to other components in the server blade system such as management modules, switch modules, the CD-ROM and the FDD. These interfaces are duplicated on the midplane to provide redundancy. A processor blade typically supports booting from the media tray CDROM or FDD, the network (Fibre channel or Ethernet), or its local hard disk drive.

A media tray MT includes a floppy disk drive and a CD-ROM drive that can be coupled to any one of the 14 blades. The media tray also houses an interface board on which is mounted interface LED's, a thermistor for measuring inlet air temperature, and a 4-port USB controller hub. System level interface controls consist of power, location, over temperature, information, and general fault LED's and a USB port.

Midplane circuit board MP is positioned approximately in the middle of chassis CH1 and includes two rows of connectors; the top row including connectors MPC-S1-R1 through MPC-S14-R1, and the bottom row including connectors MPC-S1-R2 through MPC-S14-R2. Thus, each one of the 14 slots includes one pair of midplane connectors located one above the other (e.g., connectors MPC-S1-R1 and MPC-S1-R2) and each pair of midplane connectors mates to a pair of connectors at the rear edge of each processor blade (not visible in FIG. 1).

Figure 2:
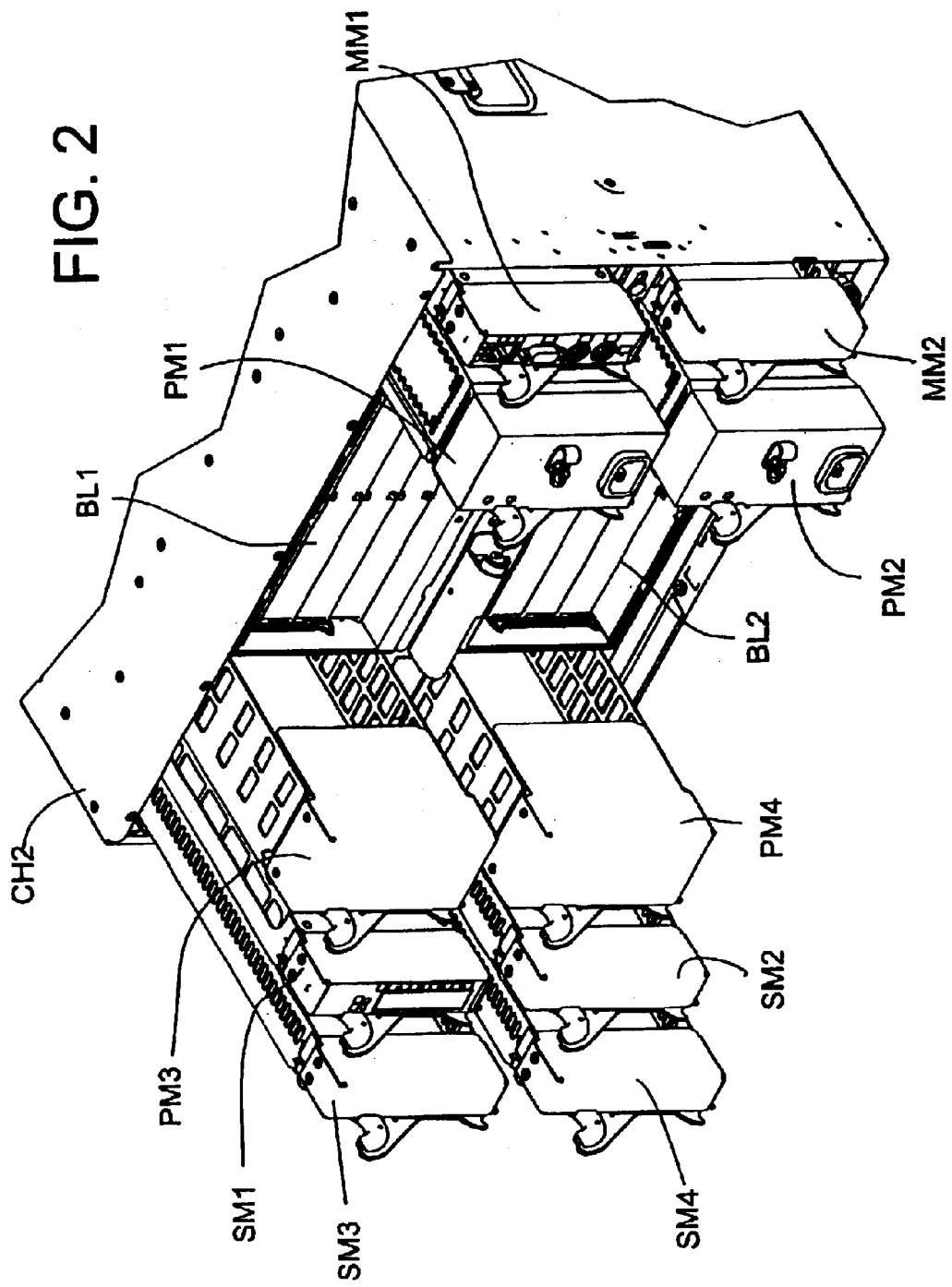
FIG. 2 is a rear, top and left side perspective view of the rear portion of the server blade system.

FIG. 2 is a rear, top and left side perspective view of the rear portion of the server blade system. Referring to FIGS. 1 and 2, a chassis CH2 houses various hot plugable components for cooling, power, control and switching. Chassis CH2 slides and latches into the rear of main chassis CH1.

Two hot plugable blowers BL1 and BL2 include backward-curved impeller blowers and provide redundant cooling to the server blade system components. Airflow is from the front to the rear of chassis CH1. Each of the processor blades PB1 through PB14 includes a front grille to admit air, and low-profile vapor chamber based heat sinks are used to cool the processors within the blades. Total airflow through the system chassis is about 300 CFM at 0.7 inches H2O static pressure drop. In the event of blower failure or removal, the speed of the remaining blower automatically increases to maintain the required air flow until the replacement unit is installed. Blower speed control is also controlled via a thermistor that constantly monitors inlet air temperature. The temperature of the server blade system components are also monitored and blower speed will increase automatically in response to rising temperature levels as reported by the various temperature sensors.

Four hot plugable power modules PM1 through PM4 provide DC operating voltages for the processor blades and other components. One pair of power modules provides power to all the management modules and switch modules, plus any blades that are plugged into slots 1–6. The other pair of power modules provides power to any blades in slots 7–14. Within each pair of power modules, one power module acts as a backup for the other in the event the first power module fails or is removed. Thus, a minimum of two active power modules are required to power a fully featured and configured chassis loaded with 14 processor blades, 4 switch modules, 2 blowers, and 2 management modules. However, four power modules are needed to provide full redundancy and backup capability. The power modules are designed for operation between an AC input voltage range of 200VAC to 240VAC at 50/60 Hz and use an IEC320 C14 male appliance coupler. The power modules provide +12VDC output to the midplane from which all server blade system components get their power. Two +12VDC midplane power buses are used for redundancy and active current sharing of the output load between redundant power modules is performed.

Management modules MM1 through MM4 are hot-pluggable components that provide basic management functions such as controlling, monitoring, alerting, restarting and diagnostics. Management modules also provide other functions required to manage shared resources, such as the ability to switch the common keyboard, video, and mouse signals among processor blades.

Figure 3:
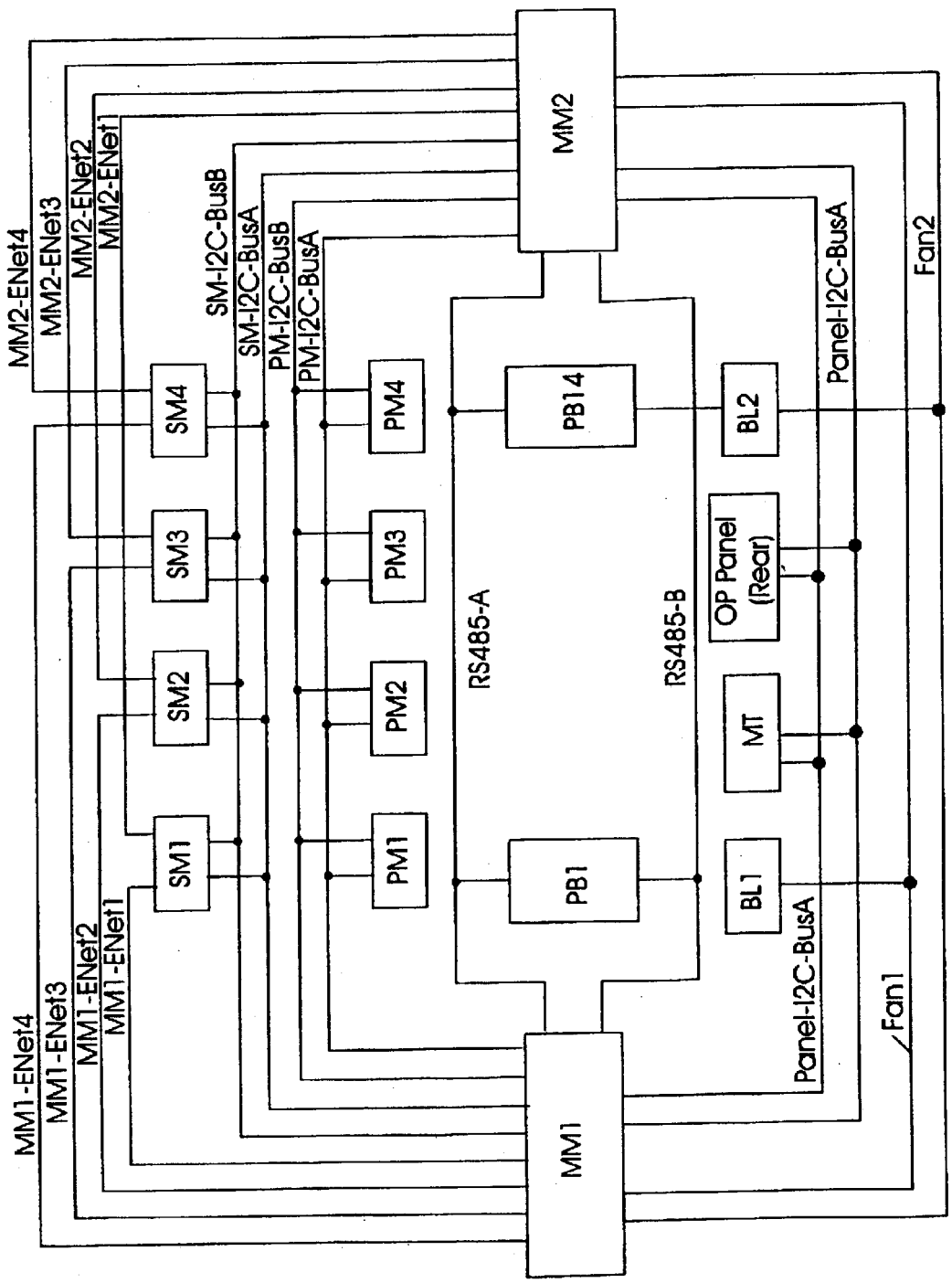
FIG. 3 is a schematic diagram of the server blade system's management subsystem.

FIG. 3 is a schematic diagram of the server blade system's management subsystem. Referring to this figure, each management module has a separate Ethernet link to each one of the switch modules SM1 through SM4. Thus, management module MM1 is linked to switch modules SM1 through SM4 via Ethernet links MM1-ENet1 through MM1-ENet4, and management module MM2 is linked to the switch modules via Ethernet links MM2-ENet1 through MM2-ENet4. In addition, the management modules are also coupled to the switch modules via two well known serial I2C buses SM-I2C-BusA and SM-I2C-BusB, which provide for "out-of-band" communication between the management modules and the switch modules. Similarly, the management modules are also coupled to the power modules PM1 through PM4 via two serial I2C buses PM-I2C-BusA and PM-I2C-BusB. Two more I2C buses Panel-I2C-BusA and Panel-I2C-BusB are coupled to media tray MT and the rear panel. Blowers BL1 and BL2 are controlled over separate serial buses Fan1 and Fan2. Two well known RS485 serial buses RS485-A and RS485-B are coupled to server blades PB1 through PB14 for "out-of-band" communication between the management modules and the server blades.

Figure 4:
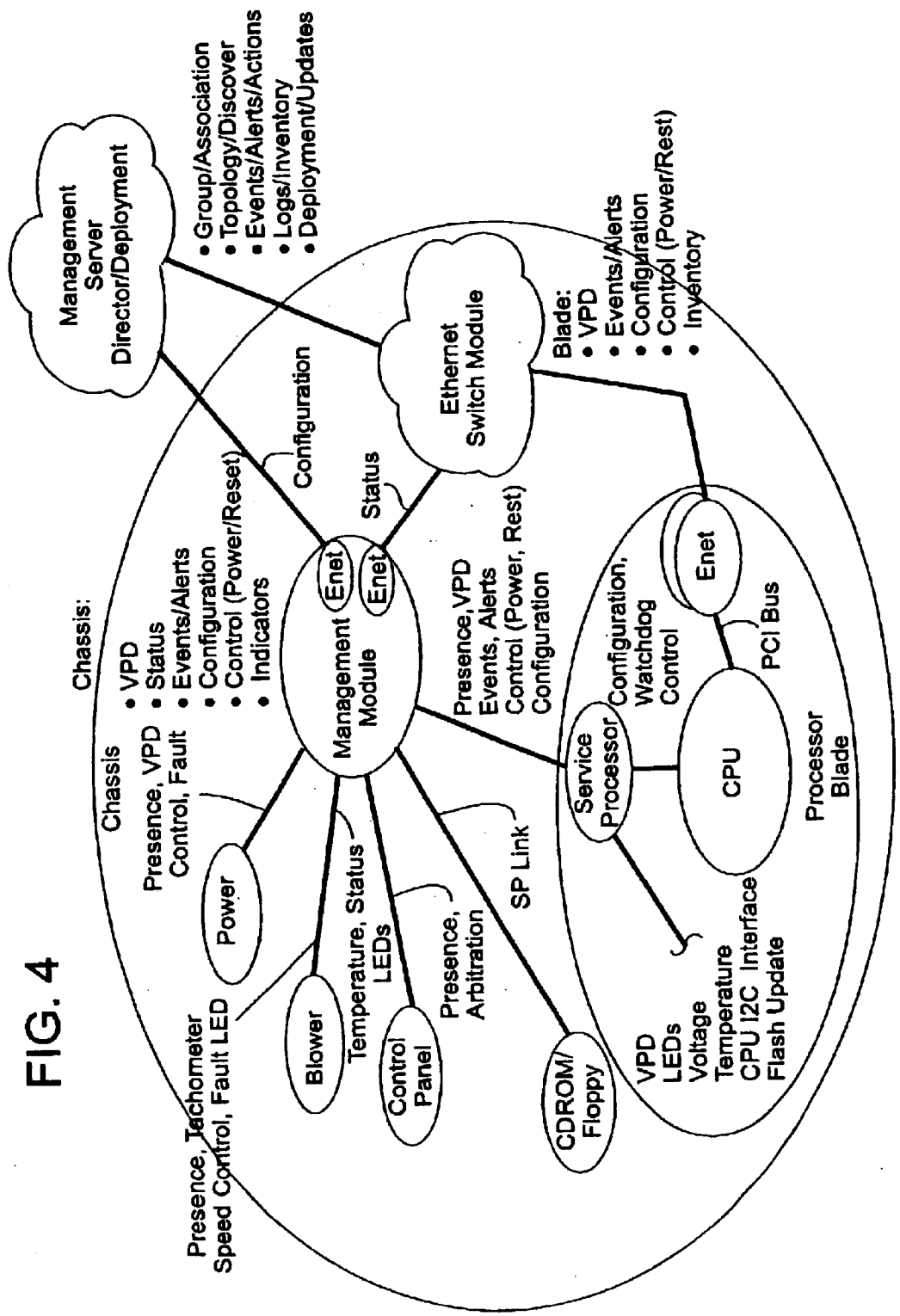
FIG. 4 is a topographical illustration of the server blade system's management functions.

FIG. 4 is a topographical illustration of the server blade system's management functions. Referring to FIGS. 3 and 4, each of the two management modules has a 100 Mbps Ethernet port that is intended to be attached to a private, secure management server. The management module firmware supports a web browser interface for either direct or remote access. Each processor blade has a dedicated service processor (SP) for sending and receiving commands to and from the management modules. The data ports that are associated with the switch modules can be used to access the processor blades for image deployment and application management, but are not intended to provide chassis management services. A management and control protocol allows the management module to authenticate individual blades as part of the blade activation procedure. A management module can also send alerts to a remote console to indicate changes in status, such as removal or addition of a blade or module. A management module also provides access to the internal management ports of the switch modules and to other major chassis subsystems (power, cooling, control panel, and media drives).

The management module communicates with each processor blade service processor via the out-of-band serial bus, with one management module acting as the master and the processor blade's service processor acting as a slave. For redundancy, there are two serial busses (one-bus per midplane connector) to communicate with each processor blade's service processor. The processor bade is responsible for activating the correct interface to the top or bottom midplane connector based upon the state of the signals from the active management module. When two management modules are installed, the module in slot 1 will normally assume the active management role, while the module in slot 2 will be reserved as a standby module. In event of management module failure or removal after the chassis subsystems have been initialized, the operation of the processor blades and switch subsystems are not affected. Thus, if both management modules are inactive or removed, the server blade system's components will continue to function, but chassis configuration cannot be changed. Addresses are hardwired for each slot on each top and bottom midplane connector, and used by a processor blade's service processor to determine which processor blade is being addressed on the serial bus.

Each of the four switch modules SM1 through SM4 has a dedicated 100 Mbps Ethernet link to the two management modules MM1 and MM2. This provides a secure high-speed communication path to each of the switch modules for control and management purposes only. The I2C serial links are used by the management module to internally provide control of the switch module and to collect system status and vendor product data ("VPD") information. To accomplish this, the various control and data areas within the switch modules, such as status and diagnostic registers and VPD information, are accessible by the management module firmware. In general, the active management module can detect the presence, quantity, type, and revision level of each blade, power module, blower, and midplane in the system, and can detect invalid or unsupported configurations (e.g., processor blades with Fibre Channel daughter cards connected to Ethernet switch modules.) This function relies upon VPD information within each subsystem as well as signals from the various hardware interfaces or communication via the service processor protocols.

Figure 5:
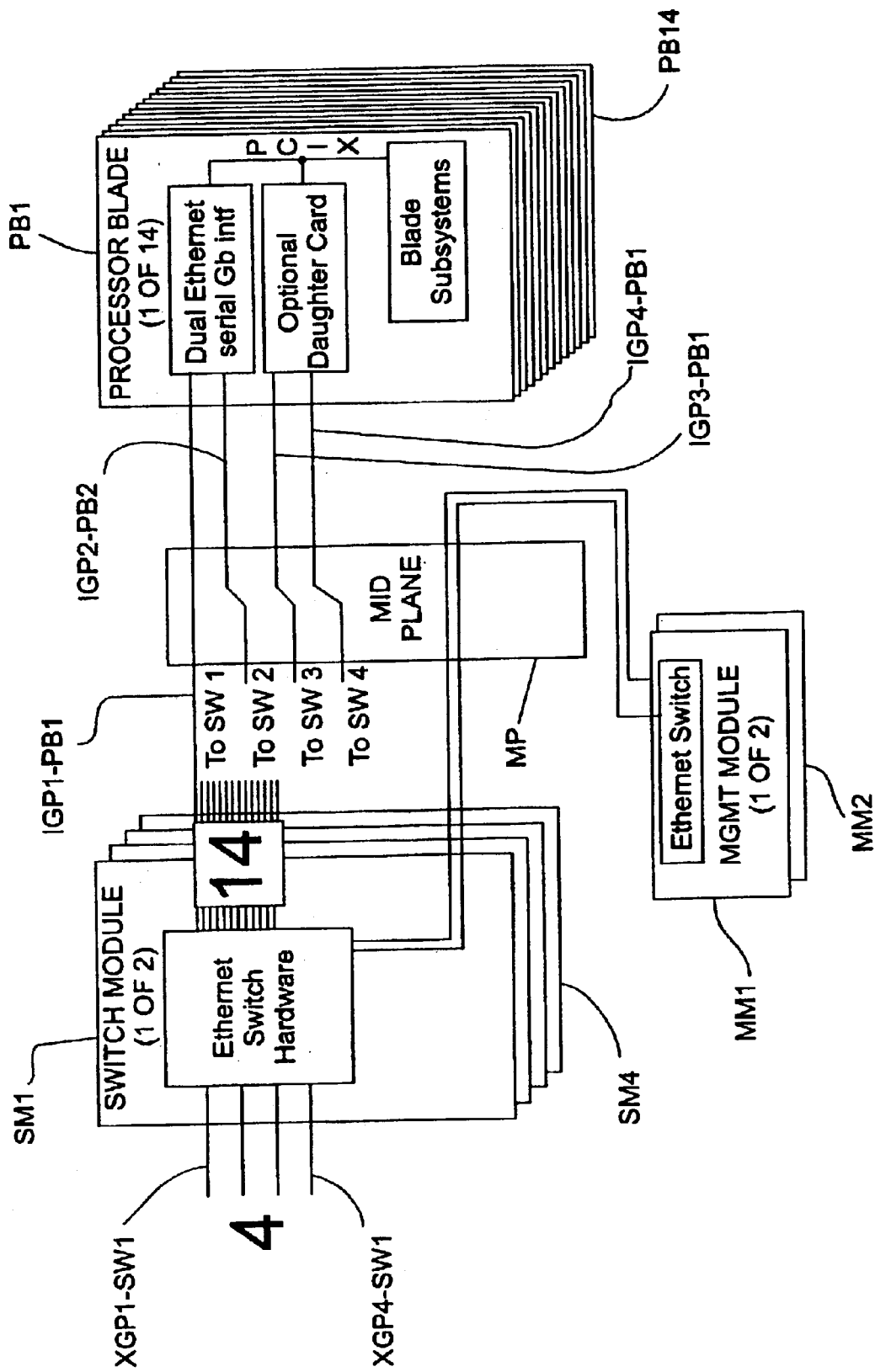
FIG. 5 is a block diagram of the switch module and processor blade interconnection.

FIG. 5 is a block diagram of the switch module and processor blade interconnection. Referring to this figure, each switch module SW1 through SW4 includes four external gigabit ports. For example, switch module SW1 includes external gigabit ports XGP1-SW1 through XGP4-SW1. Each processor blade includes four internal gigabit ports coupling the processor blade to each one of the four switch modules through the midplane connectors. For example, processor blade PB1 includes four internal gigabit ports IGP1-PB1 through IGP4-PB1. In addition, each management module is coupled to the switch module via an Ethernet link.

The Ethernet Switch Modules are hot-pluggable components that provide Ethernet switching capabilities to the server blade system. The primary purpose of the switch module is to provide Ethernet interconnectivity between the processor blades, management modules and the outside network infrastructure. Depending on the application, the external Ethernet interfaces may be configured to meet a variety of requirements for bandwidth and function. One Ethernet switch module is included in the base system configuration, while a second Ethernet switch module is recommended for redundancy. Each processor blade has a dedicated, 1000 Mbps (1 Gbps) full-duplex SERDES link to each of the two switch modules, and each switch module has four external 1 Gbps (RJ45) ports for connection to the external network infrastructure.

Fibre Channel (FC) is an industry standard networking scheme for sharing remote storage devices among a group of servers. Each processor blade includes a connector to accept a Fibre Channel daughter board containing two Fibre Channel ports of 2 Gb each for connection to dual Fibre Channel switch modules. The routing of the Fibre Channel signals occurs through the midplane to the Fibre Channel switch modules in slots 3 and 4 in the rear of the server blade chassis. Each Fibre Channel switch module is hot-pluggable without disruption of blade or chassis operation. The routing of the two Fibre Channel ports is such that one port from each processor blade is wired to one Fibre Channel switch module, and the other port is wired to the other Fibre Channel switch module to provide redundancy. Each Fibre Channel switch module has 2 external 2 Gb ports for attachment to the external Fibre Channel switch and storage infrastructure. This option allows each of the 14 processor blades to have simultaneous access to a Fibre Channel based storage area network (SAN) as well as the Ethernet based communications network.

Server Blade Airflow Damper

Figure 11:
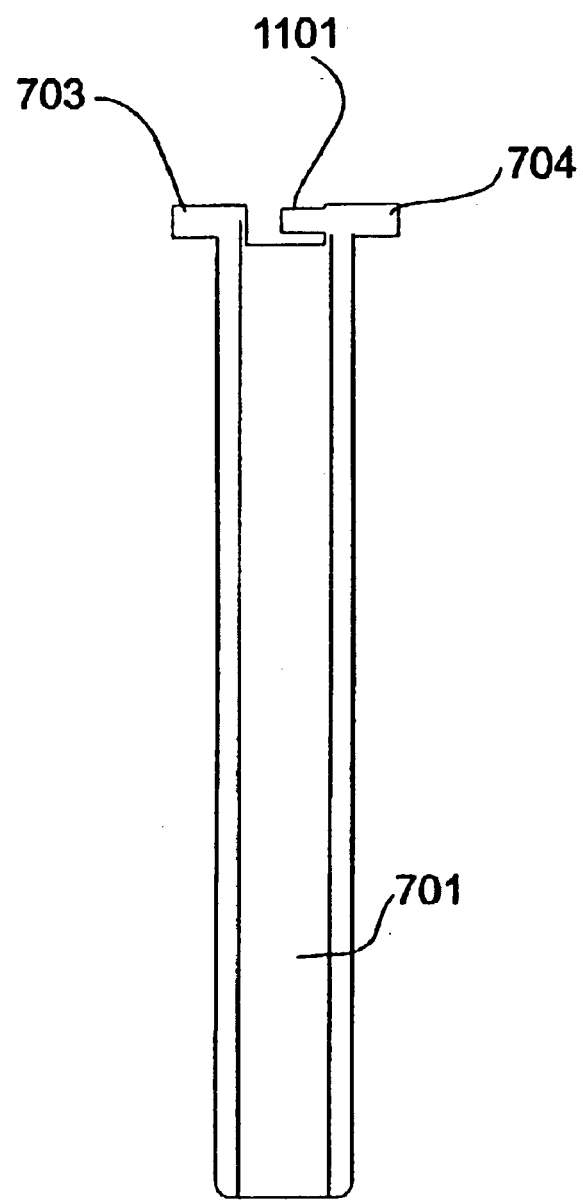
FIG. 11 is an orthographic view of a bypass damper.

FIG. 6 is perspective view of the back of the server blade chassis with the cover removed exposing the blade slot guide and bypass dampers, FIG. 7 is a perspective view of Detail "A" of FIG. 6, and FIG. 11 is an orthographic view of a bypass damper. Referring to these figures, the upper and lower blade slot guides 601 and 602 are attached to main chassis CH1 and establish the 14 slots into which server blades can be inserted. A plastic injection molded hinge pin mounting strip 603 is attached to upper guide 601. This mounting strip includes a plurality of hinge pin mounts, such as 705 and 706, for receiving the hinge pins 703 and 704 of bypass damper 701. These hinge pin mounts are "U" shaped in cross section and provide a "snap fit" for the hinge pins of the damper. A torsion spring 702 is mounted on a spring mounting pin 1101 positioned between the two hinge pins 703 and 704 as best illustrated in FIG. 11.

Figure 8:
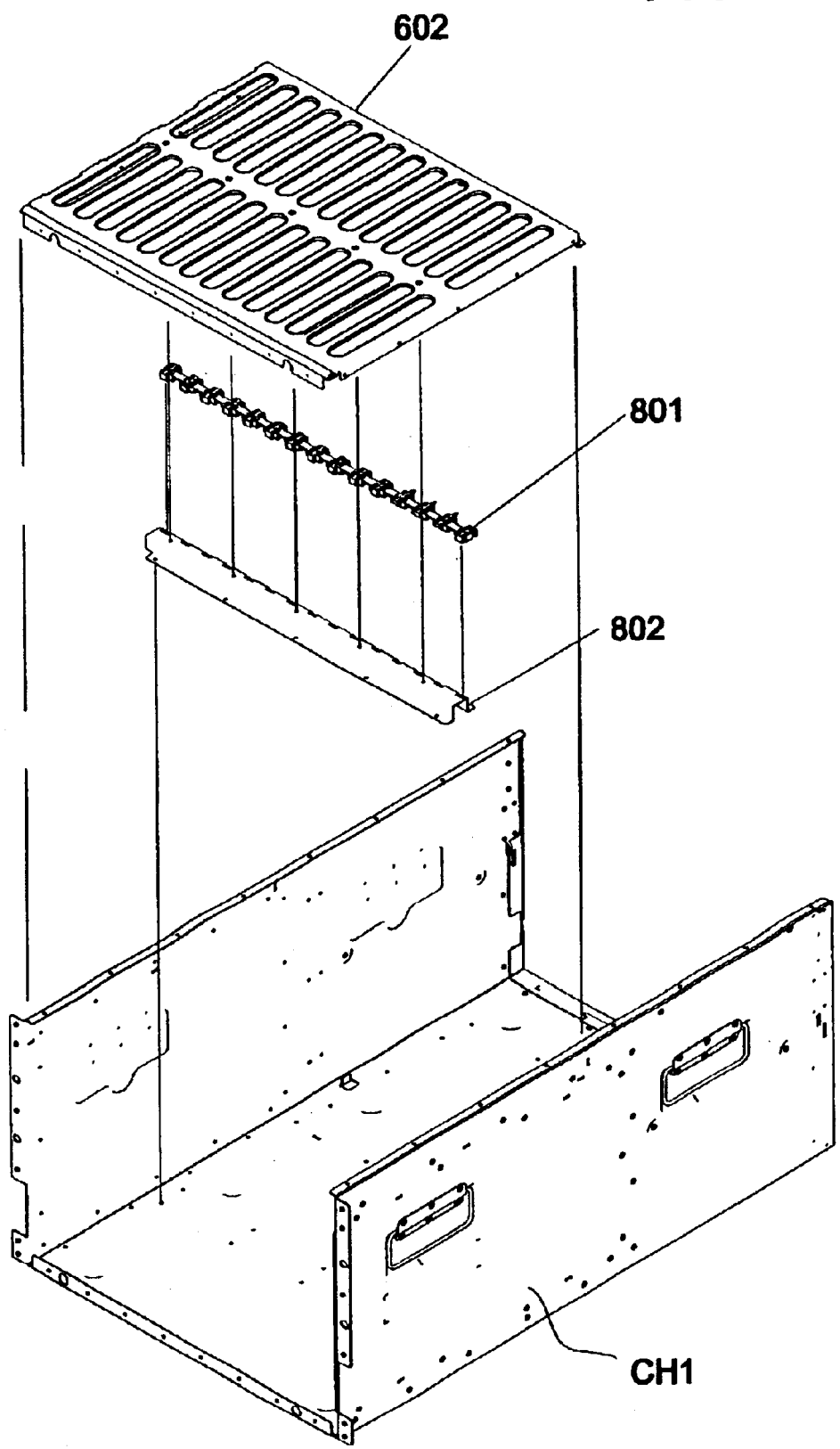
FIG. 8 is an exploded perspective view of the server blade chassis with the lower blade slot guide and hinge pin mounting strip exposed.
Figure 9:
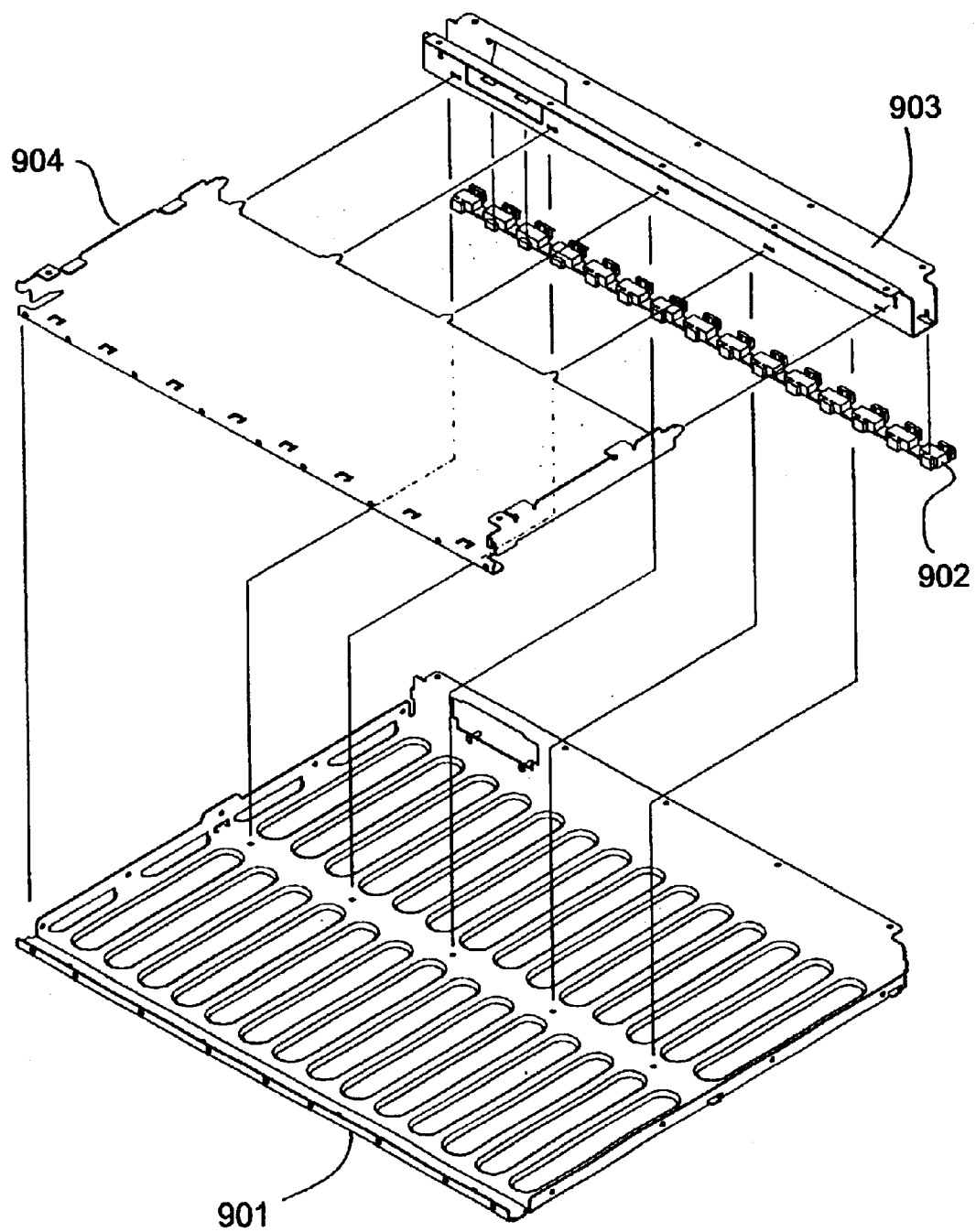
FIG. 9 is an exploded perspective view of the upper blade slot guide and corresponding hinge pin mounting strip.

FIG. 8 is an exploded perspective view of the server blade chassis with the lower blade slot guide and hinge pin mounting strip exposed, and FIG. 9 is an exploded perspective view of the upper blade slot guide and corresponding hinge pin mounting strip. Referring to these figures, lower hinge pin mounting strip 801 is attached to chassis cross member 802, and lower blade slot guide 602 is attached to the chassis over the mounting strip and cross member. Similarly, as illustrtated in FIG. 9, the upper hinge pin mounting strip is attached to cross member 903, and upper blade slot guide is attached to the chassis over the mounting strip and cross member. Tray 904 supports media tray MT.

FIGS. 10A through 10C are perspective views that illustrate the steps necessary to install the bypass damper in the hinge pin mounting strip. Referring to these figures in sequence, bypass damper 701 is positioned sideways and inserted through one of the openings in blade guide 601. As shown in FIG. 10C, damper 701 is then rotated 90 degrees and positioned above hinge pin mounting strip 603. Finally, the hinge pins 703 and 704 are "snap fitted" into hinge pin mounts 705 and 706, which are "U" shaped in cross section and provide a compression fit to hold the hinge pins in position.

There are two byspass dampers per blade slot; one swings up from the bottom of the chassis and the other swings down from the top of the chassis. In operation, the torsion spring causes each damper to rotate into the slot when the slot is empty (i.e., server blade removed from the slot), thereby obstructing the flow of air through the slot. This obstruction causes more air to flow through the slots that contain server blades, thereby increasing the flow of air through any server blades that are installed in slots. When a server blade is inserted into a slot, the blades enclosure pushes on the dampers, causing the dampers to rotate out of the slot.

We claim as our invention:

1. A server blade system for use with first and second server blades, wherein each server blade has at least one air flow opening, said server blade system comprising:

a chassis having first and second slots, wherein a server blade can be inserted into each of said slots;

an air moving device for moving air through a first server blade when the first server blade is installed into said first slot;

a bypass damper positioned in said second slot, said bypass damper having first and second positions, said bypass damper obstructing the flow of air through said second slot when said bypass damper is in said second position, said bypass damper being moved to said first position in response to a second server blade being inserted into said second slot, said bypass damper being moved to said second position in response to the removal of the second server blade from said second slot.

2. The server blade system of claim 1, wherein said bypass damper is pivotally mounted within said second slot, such that said bypass damper rotates between said first and second positions.

3. The server blade system of claim 2, further comprising a torsion spring for moving said bypass damper from said first to said second position.

4. The server blade system of claim 3, further comprising:

a first hinge pin;

a hinge pin mount, said hinge pin mount being "U" shaped in cross section and providing a snap fit for said first hinge pin.

5. The server blade system of claim 4, further comprising:

a second hinge pin spaced apart from said first hinge pin;

a spring mounting pin positioned between said first and second hinge pins, wherein said torsion spring is mounted on said spring mounting pin.

6. The server blade system of claim 2, further comprising:

a hinge pin;

a hinge pin mount, said hinge pin mount being "U" shaped in cross section and providing a snap fit for said hinge pin.

7. The server blade system of claim 3, further comprising:

first and second hinge pins, said first hinge pin being spaced apart from said second hinge pin;

a spring mounting pin positioned between said first and second hinge pins, wherein said torsion spring is mounted on said spring mounting pin.

* * * * *